(12) United States Patent
Kishioka et al.

(10) Patent No.: US 9,140,989 B2
(45) Date of Patent: Sep. 22, 2015

(54) PHOTOSENSITIVE ORGANIC PARTICLES

(75) Inventors: Takahiro Kishioka, Toyama (JP);
Makiko Umezaki, Toyama (JP); Shigeo Kimura, Toyama (JP); Hirokazu Nishimaki, Toyama (JP); Tomoya Ohashi, Toyama (JP); Yuki Usui, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/111,021

(22) PCT Filed: Apr. 11, 2012

(86) PCT No.: PCT/JP2012/059894
§ 371 (c)(1),
(2), (4) Date: Oct. 10, 2013

(87) PCT Pub. No.: WO2012/141210
PCT Pub. Date: Oct. 18, 2012

(65) Prior Publication Data
US 2014/0045119 A1 Feb. 13, 2014

(30) Foreign Application Priority Data
Apr. 12, 2011 (JP) ................. 2011-088286

(51) Int. Cl.
*G03F 7/004* (2006.01)
*G03F 7/32* (2006.01)
(Continued)

(52) U.S. Cl.
CPC .............. *G03F 7/20* (2013.01); *C08F 220/54* (2013.01); *G03F 7/004* (2013.01); *G03F 7/0045* (2013.01);
(Continued)

(58) Field of Classification Search
CPC ..... G03F 7/004; G03F 7/0045; G03F 7/0046; G03F 7/0382; G03F 7/20; G03F 7/32; C08F 220/54; C08F 220/30; C08F 220/56
USPC ............................................... 430/270.1, 325
See application file for complete search history.

(56) References Cited

U.S. PATENT DOCUMENTS

| 3,440,047 A | 4/1969 | Levinos et al. |
| 4,772,646 A * | 9/1988 | Harms et al. .................... 524/27 |

(Continued)

FOREIGN PATENT DOCUMENTS

| EP | 0 530 957 A1 | 3/1993 |
| EP | 0 548 870 A1 | 6/1993 |

(Continued)

OTHER PUBLICATIONS

Oct. 27, 2014 Search Report issued in European Patent Application No. 12771827.8.
(Continued)

*Primary Examiner* — Amanda C Walke
(74) *Attorney, Agent, or Firm* — Oliff PLC

(57) ABSTRACT

A material forms a pattern by applying a photosensitive composition to a base material and drying to form a photosensitive coating and performing exposure and development, and a method for forming the pattern. A photosensitive composition includes water-soluble organic particles, and a solvent, wherein the solvent is a poor solvent for the water-soluble organic particles. Preferably, the water-soluble organic particles of the photosensitive composition includes a polymer which contains a unit structure (A) for forming organic particles, a unit structure (B) for forming interparticle crosslinkage, and a unit structure (C) for imparting dispersibility, and the photosensitive composition further includes a photoacid generator. In addition, the water-soluble organic particles of the photosensitive composition includes a polymer which contains the unit structure (A) for forming organic particles, the unit structure (B) for forming interparticle crosslinkage, the unit structure (C) for imparting dispersibility, and a unit structure (D) having a photoacid generating group.

12 Claims, 1 Drawing Sheet

(51) Int. Cl.
  G03F 7/20 (2006.01)
  C08F 220/54 (2006.01)
  G03F 7/038 (2006.01)
  C08F 220/20 (2006.01)
  C08F 220/30 (2006.01)
  C08F 220/56 (2006.01)
  C08F 220/58 (2006.01)

(52) U.S. Cl.
  CPC ............ G03F 7/0046 (2013.01); G03F 7/0048 (2013.01); G03F 7/0382 (2013.01); G03F 7/0388 (2013.01); G03F 7/32 (2013.01); C08F 220/20 (2013.01); C08F 220/30 (2013.01); C08F 220/56 (2013.01); C08F 220/58 (2013.01)

(56) References Cited

U.S. PATENT DOCUMENTS 5,621,058 A    4/1997   Kondo et al.
6,130,303 A *  10/2000  Neff et al. .................... 526/306
2005/0153239 A1  7/2005   Hoshi et al.
2005/0227166 A1  10/2005  Ichimura et al.
2006/0293425 A1  12/2006  Nakanishi et al.

FOREIGN PATENT DOCUMENTS

| JP | A 8-3251     | 1/1996  |
| JP | A 8-120003   | 5/1996  |
| JP | A 2004-37955 | 2/2004  |
| JP | A 2004-109951| 4/2004  |
| JP | A 2005-70579 | 3/2005  |
| JP | A 2005-271576| 10/2005 |
| JP | A 2010-197996| 9/2010  |

OTHER PUBLICATIONS

Translation of May 22, 2012 Written Opinion issued in International Patent Application No. PCT/JP2012/059894.

May 22, 2012 Search Report issued in International Patent Application No. PCT/JP2012/059894.

\* cited by examiner

PHOTOSENSITIVE ORGANIC PARTICLES

TECHNICAL FIELD

The present invention relates to a photosensitive composition containing photopatternable water-soluble organic fine particles, and a patterning method using the composition.

BACKGROUND ART

In the prior art, there is a disclosure regarding a method for preparing organic fine particles, in which a monomer formed of a hydrophilic monomer, a (meth)acrylamide-based monomer, and a crosslinkable unsaturated monomer (for example, a polyacrylate compound) is polymerized in a solvent which dissolves the monomer but does not dissolve the generated polymer (see Patent documents 1 and 2).

In the above documents, the crosslinkable unsaturated monomer is a monomer that causes intramolecular crosslinking, and by the above preparation method, a dispersion of crosslinked particles (polymer) is formed. Among the above monomers, the hydrophilic monomer is considered to exert an effect of causing the generated polymer (fine particles) to stably disperse. The obtained polymer is about 0.03 μm to 1 μm. If a base material is coated with a composition using these hydrophilic organic fine particles, a coating having excellent hydrophilicity can be obtained. Accordingly, use of this composition in a hydrophilizing agent, a liquid crystal spacer, a column filler, a fouling-resistant coating material, and the like is under study.

PRIOR ART DOCUMENTS

Patent Documents

Patent Document 1: Japanese Patent Application Publication No. 8-003251 (JP 8-003251 A)
Patent Document 2: Japanese Patent Application Publication No. 8-120003 (JP 8-120003 A)

SUMMARY OF THE INVENTION

Problem to be Solved by the Invention

The present invention provides a photopatternable photosensitive composition. The present invention is a photosensitive composition which contains water-soluble organic particles and a solvent, in which the solvent is a poor solvent for the water-soluble organic particles.

A material, which makes it possible to form a pattern by applying the photosensitive composition of the present invention to a base material and drying to form a photosensitive coating and performing exposure and development, and a method for forming the pattern are provided.

Means for Solving the Problem

That is, the present invention relates to: as a first aspect, a photosensitive composition comprising water-soluble organic particles and a solvent, in which the solvent is a poor solvent for the water-soluble organic particles;

as a second aspect, the photosensitive composition according to the first aspect, in which the water-soluble organic particles include a polymer which contains a unit structure (A) for forming organic particles, a unit structure (B) for forming interparticle crosslinkage, and a unit structure (C) for imparting dispersibility, and the photosensitive composition further comprises a photoacid generator;

as a third aspect, the photosensitive composition according to the first aspect, in which the water-soluble organic particles include a polymer which contains the unit structure (A) for forming organic particles, the unit structure (B) for forming interparticle crosslinkage, the unit structure (C) for imparting dispersibility, and a unit structure (D) having a photoacid generating group;

as a fourth aspect, the photosensitive composition according to the second or third aspect, in which a monomer forming the unit structure (A) is (meth)acrylic acid amide, N-alkyl(meth)acrylic acid amide, or N-aryl(meth)acrylic acid amide;

as a fifth aspect, the photosensitive composition according to the second or third aspect, in which a monomer forming the unit structure (B) is N-hydroxyalkyl(meth)acrylic acid amide, N-hydroxyaryl(meth)acrylic acid amide, N-alkoxyalkyl(meth)acrylic acid amide, N-alkoxyaryl(meth)acrylic acid amide, hydroxyalkyl(meth)acrylate, hydroxyaryl(meth)acrylate, alkoxyalkyl(meth)acrylate, or alkoxyaryl(meth)acrylate;

as a sixth aspect, the photosensitive composition according to the second or third aspect, in which a monomer forming the unit structure (C) is a compound obtained by esterifying (meth)acrylic acid using polyether;

as a seventh aspect, the photosensitive composition according to any one of the second to sixth aspects, in which the water-soluble organic particles contain the unit structure (A), the unit structure (B), and the unit structure (C) at a molar ratio of 1:0.01 to 3.00:0.0001 to 0.1 (A:B:C);

as an eighth aspect, the photosensitive composition according to any one of the third to sixth aspects, in which the water-soluble organic particles contain the unit structure (A), the unit structure (B), the unit structure (C), and the unit structure (D) at a molar ratio of 1:0.01 to 3.00:0.0001 to 0.1:0.1 to 3.00 (A:B:C:D);

as a ninth aspect, the photosensitive composition according to any one of the first to eighth aspects, in which the poor solvent is a solvent including ether, ester, hydrocarbon, ketone, aldehyde, or alcohol;

as a tenth aspect, the photosensitive composition according to any one of the first to eighth aspects, in which the poor solvent is a solvent including propylene glycol monomethyl ether, propylene glycol monomethyl ether acetate, ethylene glycol monobutyl ether, ethanol, propanol, isopropanol, or butanol;

as an eleventh aspect, a pattern forming method including a step of applying the photosensitive composition according to any one of the first to tenth aspects to a base material and drying to form a photosensitive coating, a step of exposing the coating to light through a mask, and a step of performing developing using a developer;

as a twelfth aspect, the pattern forming method according to the eleventh aspect, further comprising a step of performing heating after the step of exposing; and as a thirteenth aspect, the pattern forming method according to the eleventh or twelfth aspect, in which the developer is water or an aqueous medium.

Effects of the Invention

The photosensitive composition of the present invention contains water-soluble organic particles and a solvent which is a poor solvent for the organic particles. That is, the water-soluble organic particles are present as organic particles without dissolving in the solvent. Moreover, the photosensitive composition of the present invention is a composition in which the water-soluble organic particles disperse excellently even if a dispersion stabilizer is not used. Therefore, a uniform photosensitive coating can be formed on a base material without being influenced by the use of a dispersion stabilizer.

Further, in the photosensitive composition of the present invention, the water-soluble organic particles maintain their properties as particles without dissolving in the poor solvent for the photosensitive composition. However, the water-soluble organic particles dissolve in a developer (for example, water). Accordingly, when the photosensitive composition is applied to a base material and dried to form a photosensitive coating and exposed to light through a mask, developing can be easily performed using a developer (for example, water) and a pattern can be formed.

Consequently, for example, if the water-soluble organic particles are a biocompatible material, or if a biocompatible material is added to the water-soluble organic particles, the biocompatible organic particles can be photopatterned. In this pattern, if the pattern portion can inhibit the absorption of a protein, for example, cell culture can be controlled by patterning.

In this way, the photosensitive composition of the present invention is expected to be applied to medical instruments such as a cell culture substrate, a biochip, a biosensor, and a microarray chip.

MODES FOR CARRYING OUT THE INVENTION

Figure 1:
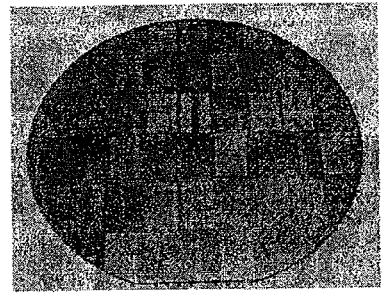
FIG. 1 is a view showing a 500 μm×500 μm square pattern formed on a silicon wafer using a photosensitive composition 1 prepared in Example 1.

The present invention is a photosensitive composition which contains water-soluble organic particles and a solvent, in which the solvent is a poor solvent for the water-soluble organic particles.

The water-soluble organic particles are obtained by making a water-soluble organic resin into particles, and preferably include a polymer containing a unit structure (A) for forming organic particles, a unit structure (B) for forming interparticle crosslinkage, and a unit structure (C) for imparting dispersibility. In this case, the photosensitive composition further contains a photoacid generator.

Alternatively, the water-soluble organic particles include a polymer containing the unit structure (A) for forming organic particles, the unit structure (B) for forming interparticle crosslinkage, the unit structure (C) for imparting dispersibility, and a unit structure (D) having a photoacid generating group.

The unit structure (B) forms crosslinkage between the organic particles by an acid generated from the photoacid generator or from the photoacid generating group in the unit structure (D) by means of light for exposure during exposure, and plays a role of forming a pattern without being removed by a developer in developing treatment performed later. Moreover, the portion that is not irradiated with the light for exposure is removed by the developer without being crosslinked.

The unit structure (C) is a unit structure which plays a role necessary for exhibiting excellent dispersibility in the poor solvent of the photosensitive composition without causing the organic particles to aggregate.

Further, the unit structure (A) is a unit structure which is for forming particles and plays a role of arranging the unit structure (B), the unit structure (C), and optionally the unit structure (D) at an appropriate interval in the organic particles.

The organic particles contained in the photosensitive composition of the present invention are formed of a polymer containing the unit structures that have their respective properties.

Examples of the monomer forming the unit structure (A) for forming organic particles include (meth)acrylic acid amide, N-alkyl(meth)acrylic acid amide, N-aryl(meth)acrylic acid amide, and the like. In the present specification, the (meth)acrylic acid refers to both the methacrylic acid and acrylic acid.

Examples of the alkyl group in the N-alkyl(meth)acrylic acid amide include $C_{1-10}$ alkyl groups. The examples include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, and the like.

Examples of the aryl group in the N-aryl(meth)acrylic acid amide include $C_{6-30}$ aryl groups. The examples include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, and the like.

The monomer forming the unit structure (B) for forming interparticle crosslinkage is a unit structure having a hydroxy group forming crosslinkage between particles. Examples of the monomer include N-hydroxyalkyl(meth)acrylic acid amide, N-hydroxyaryl(meth)acrylic acid amide, N-alkoxyalkyl(meth)acrylic acid amide, N-alkoxyaryl(meth)acrylic acid amide, hydroxyalkyl(meth)acrylate, hydroxyaryl(meth)acrylate, alkoxyalkyl(meth)acrylate, alkoxyaryl(meth)acrylate, and the like.

As the alkyl group or aryl group in these compounds, the groups exemplified as the alkyl group in the N-alkyl(meth)acrylic acid amide or the aryl group in the N-aryl(meth)acrylic acid amide can be used.

Examples of the alkoxy group include $C_{1-10}$ alkoxy groups. The examples include a methoxy group, an ethoxy group, a n-propoxy group, an i-propoxy group, a n-butoxy group, an i-butoxy group, a s-butoxy group, a t-butoxy group, a n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group, and the like.

Examples of the monomer forming the unit structure (C) for imparting dispersibility include unit structures formed of compounds obtained by esterifying (meth)acrylic acid using polyether. These compounds are compounds obtained by esterifying a carboxyl group of (meth)acrylic acid using polyether. Polyether is a polymer in which a large number of oxyalkylene units are connected to each other, and a degree of polymerization thereof is, for example, 10 to 200 or 20 to 120. The unit structure (C) can cause grafting of polymers, and contribute to excellent dispersibility that is exhibited when the generated polymer is made into organic particles.

Moreover, examples of the alkylene group in the oxyalkylene unit include alkylene groups derived from the above alkyl groups, and for example, ethylene and propylene can be suitably used. The terminal of polyether is an alkyl group bonded to an oxygen atom by an ether bond. Examples of the alkyl group include the above alkyl groups, and for example, a methyl group can be preferably used.

Examples of the unit structure (C) include unit structures formed from compounds of the following Formulae (C-1) and (C-2).

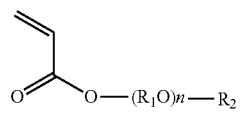

Formula (C-1)

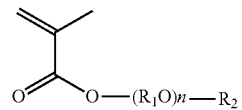

Formula (C-2)

In Formulae (C-1) and (C-2), $R_1$ is an alkylene group of the above oxyalkylene unit, and $R_2$ is the above terminal alkyl group. n indicates a degree of polymerization of the oxyalkylene unit, which is, for example, 10 to 200 or 20 to 120.

As the compound of Formula (C-1), a compound that is obtained by esterifying a carboxyl group of an acrylic acid using polyether including oxyethylene having a degree of polymerization of 90 and that has a methyl group as the terminal thereof is commercially available under the trade name of Blemmer PME4000 and PME1000 from NOF CORPORATION.

When the water-soluble organic particles are formed of the polymer containing the unit structures (A) to (C), the photosensitive composition further contains the photoacid generator described in detail below.

Moreover, if a portion of the photoacid generator described below is bonded to a unit structure (for example, an acryloyl group or methacryloyl group) of a polymer, the photoacid generator can be used as a monomer forming the unit structure (C) having a photoacid generating group.

Examples of the photoacid generator used in the photosensitive composition of the present invention include onium salt compounds, sulfonimide compounds, disulfonyl diazomethane compounds, and the like.

Examples of onium salt compounds effective for a KrF excimer laser (wavelength of 248 nm) and an ArF excimer laser (wavelength of 193 nm) include iodonium salt compounds such as diphenyliodonium hexafluorophosphate, diphenyliodonium trifluoromethane sulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate and bis(4-tert-butylphenyl)iodonium trifluoromethanesulfonate; sulfonium salt compounds such as triphenylsulfonium hexafluoroantimonate, triphenylsulfonium nonafluoro-n-butanesulfonate, triphenylsulfonium camphorsulfonate, triphenylsulfonium trifluoromethanesulfonate; and the like.

Examples of the sulfonimide compound include N-(trifluoromethanesulfonyloxy)succinimide, N-(nonafluoro-n-butanesulfonyloxy)succinimide, N-(camphorsulfonyloxy)succinimide, N-(trifluoromethanesulfonyloxy)nathalimide, and the like.

Examples of disulfonyl diazomethane compounds effective for a KrF excimer laser (wavelength of 248 nm) and an ArF excimer laser (wavelength of 193 nm) include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, methylsulfonyl-p-toluenesulfonyldiazomethane, and the like.

In addition, as photoacid generators for g-rays (wavelength of 436 nm), h-rays (wavelength of 405 mm), and i-rays (wavelength of 365 nm), compounds of the following Chemical Formulae (2-1) to (2-5) can be used.

Formula (2-1)
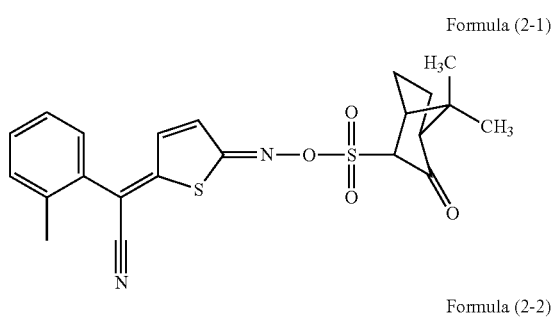

Formula (2-2)
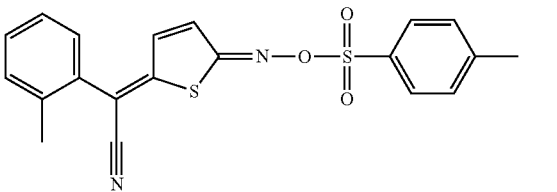

Formula (2-3)
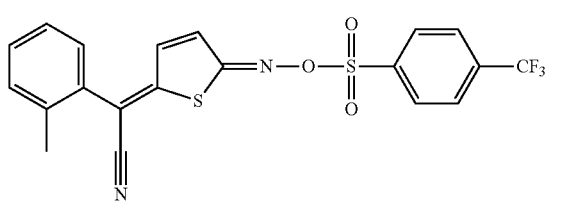

Formula (2-4)
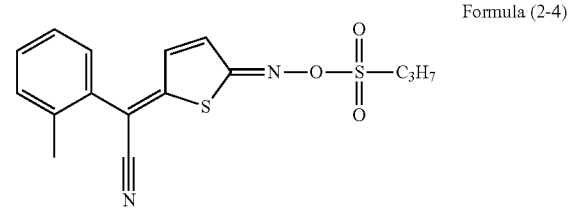

Formula (2-5)
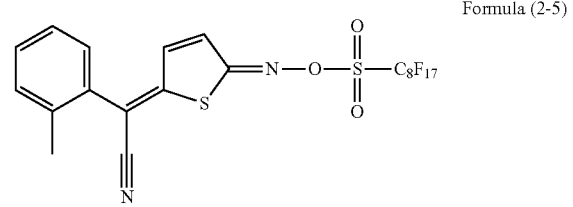

The above photoacid generator can be used by being combined with another photoacid generator described below, in a proportion of less than 50% by mass of the entire photoacid generator. Specifically, as the above another photoacid generator, triazine-based compounds, acetophenone derivative compounds, disulfone-based compounds, diazomethane-based compounds, sulfonic acid derivative compounds, diaryliodonium salts, triarylsulfonium salts, triarylphosphonium salts, iron arene complexes, and the like can be used, but the present invention is not limited to these. Specific examples of the photoacid generator include diphenyliodonium chloride, diphenyliodonium mesylate, diphenyliodonium tosylate, diphenyliodonium bromide, diphenyliodonium tetrafluoroborate, diphenyliodonium hexafluoroantimonate, diphenyliodonium hexafluoroarsenate, bis(p-tert-butylphenyl)iodonium hexafluorophosphate, bis(p-tert-butylphenyl) iodonium mesylate, bis(p-tert-butylphenyl)iodonium tosylate, bis(p-tert-butylphenyl)iodonium tetrafluoroborate, bis(p-tert-butylphenyl)iodonium chloride, bis(p-chlorophenyl)iodonium chloride, bis(p-chlorophenyl)iodonium tetrafluoroborate, triphenylsulfonium chloride, triphenylsulfonium bromide, tri(p-methoxyphenyl)sulfonium tetrafluoroborate, tri(p-methoxyphenyl)sulfonium hexafluorophosphonate, tri(p-methoxyphenyl)sulfonium tetrafluoroborate, triphenylphosphonium chloride, triphenylphosphonium bromide, tri(p-methoxyphenyl)phosphonium tetrafluoroborate, tri(p-methoxyphenyl)phosphonium hexafluorophosphonate, tri(p-ethoxyphenyl)phosphonium tetrafluoroborate, and the like.

Moreover, as the above another photoacid generator for g-rays (wavelength of 436 nm), h-rays (wavelength of 405 nm), and i-rays (wavelength of 365 nm), compounds of the following Chemical Formulae (2-6) to (2-69) can be used.

Formula (2-6)
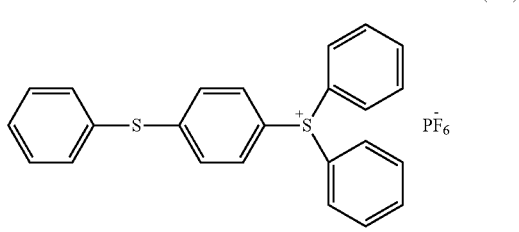

Formula (2-7)
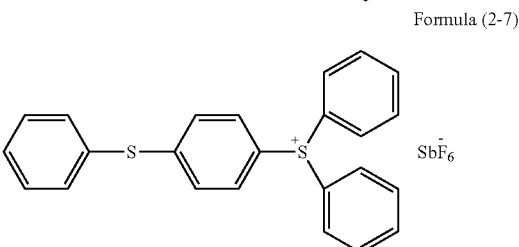

Formula (2-8)
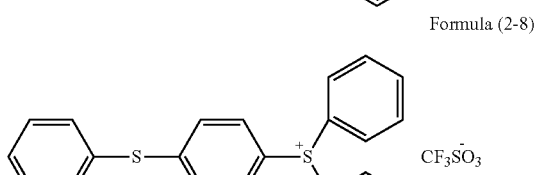

Formula (2-9)
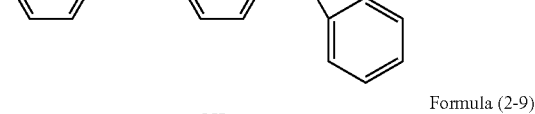

Formula (2-10)
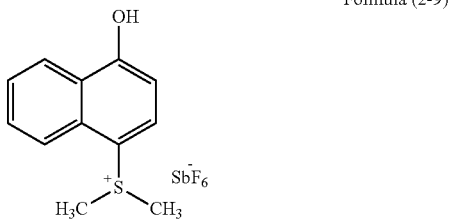

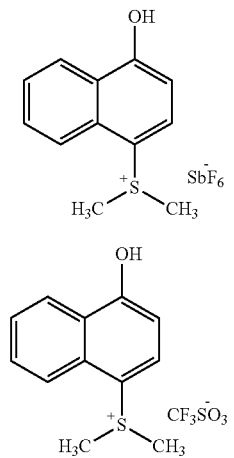

-continued

Formula (2-11)

Formula (2-12)

Formula (2-13)

Formula (2-14)

Formula (2-15)

Formula (2-16)

Formula (2-17)

Formula (2-18)

Formula (2-19)

Formula (2-20)

-continued

Formula (2-21)

Formula (2-22)

Formula (2-23)

Formula (2-24)

Formula (2-25)

Formula (2-26)

Formula (2-27)

Formula (2-28)

Formula (2-29)

Formula (2-30)
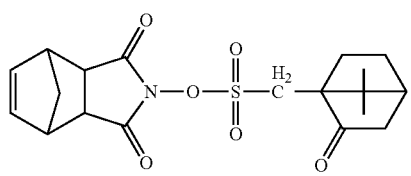
Formula (2-31)
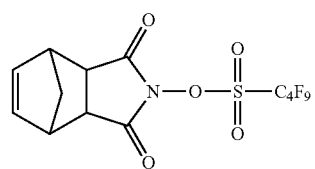
Formula (2-32)
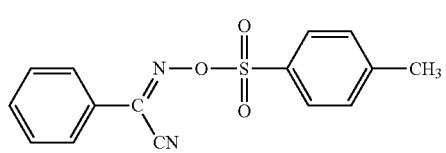
Formula (2-33)
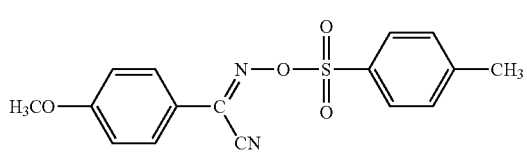
Formula (2-34)
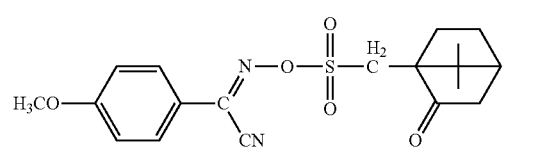
Formula (2-35)
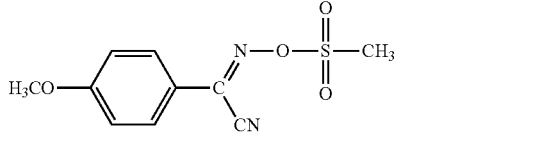
Formula (2-36)
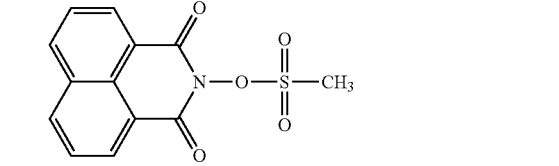
Formula (2-37)
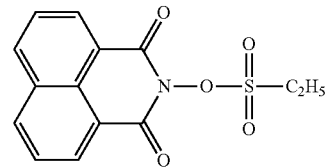
Formula (2-38)
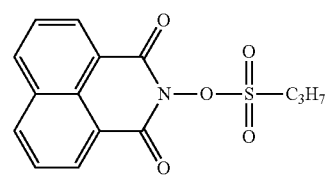
Formula (2-39)
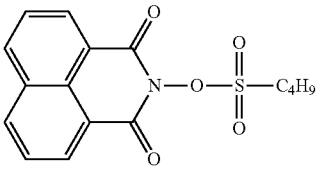
Formula (2-40)
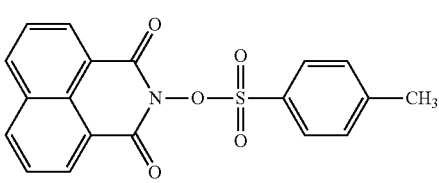
Formula (2-41)
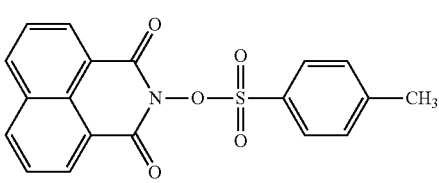
Formula (2-42)
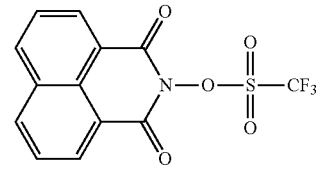
Formula (2-43)
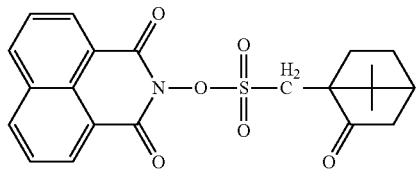
Formula (2-44)
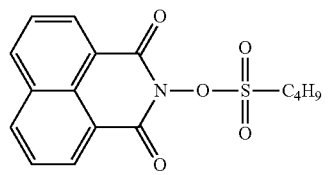
Formula (2-45)
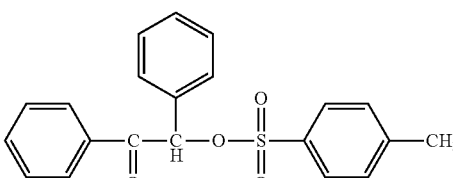
Formula (2-46)
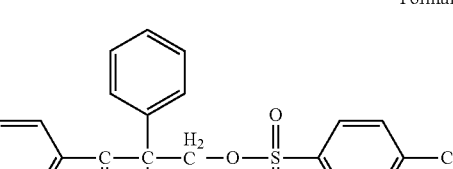
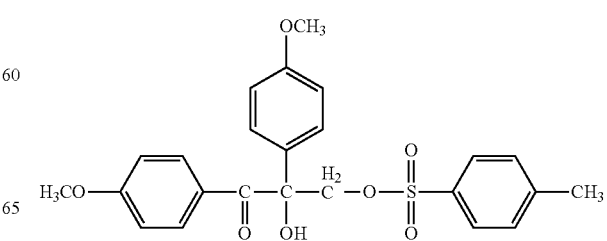

Formula (2-47)
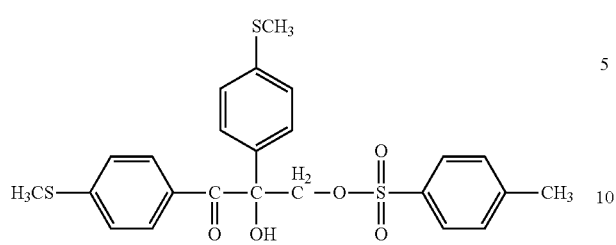
Formula (2-48)
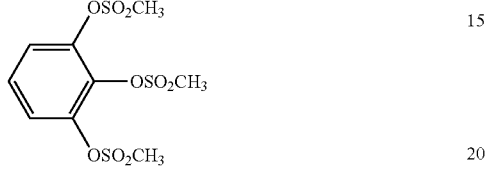
Formula (2-49)
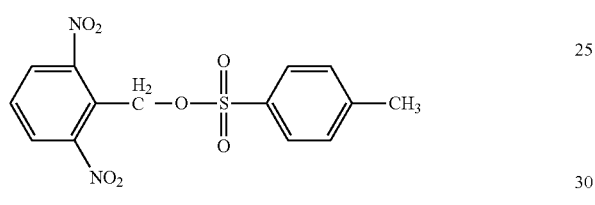
Formula (2-50)
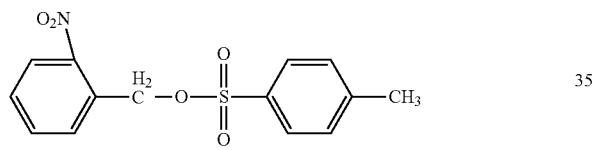
Formula (2-51)
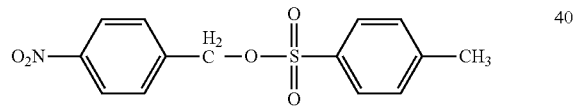
Formula (2-52)
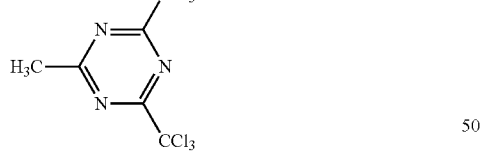
Formula (2-53)
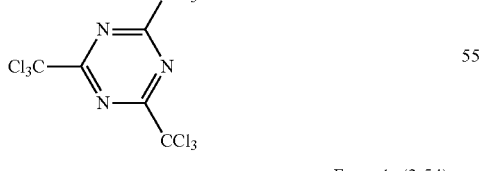
Formula (2-54)
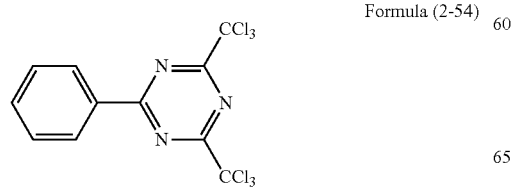
Formula (2-55)
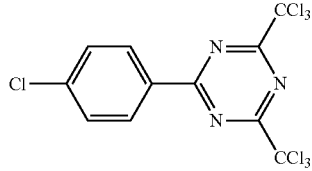
Formula (2-56)
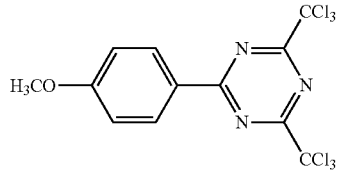
Formula (2-57)
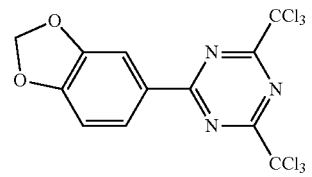
Formula (2-58)
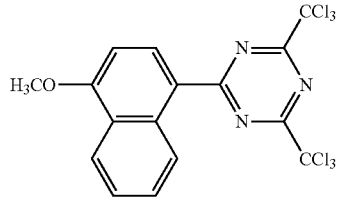
Formula (2-59)
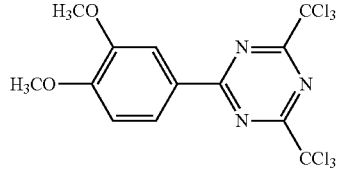
Formula (2-60)
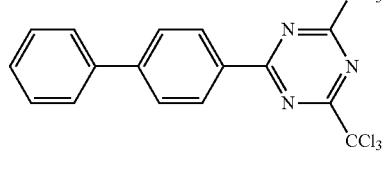
Formula (2-61)
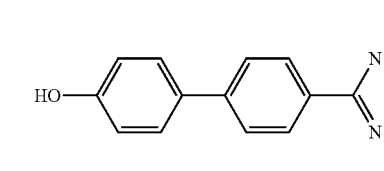
Formula (2-62)
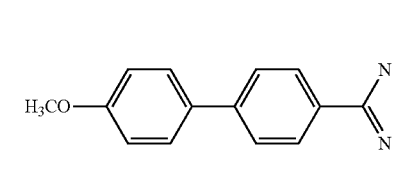

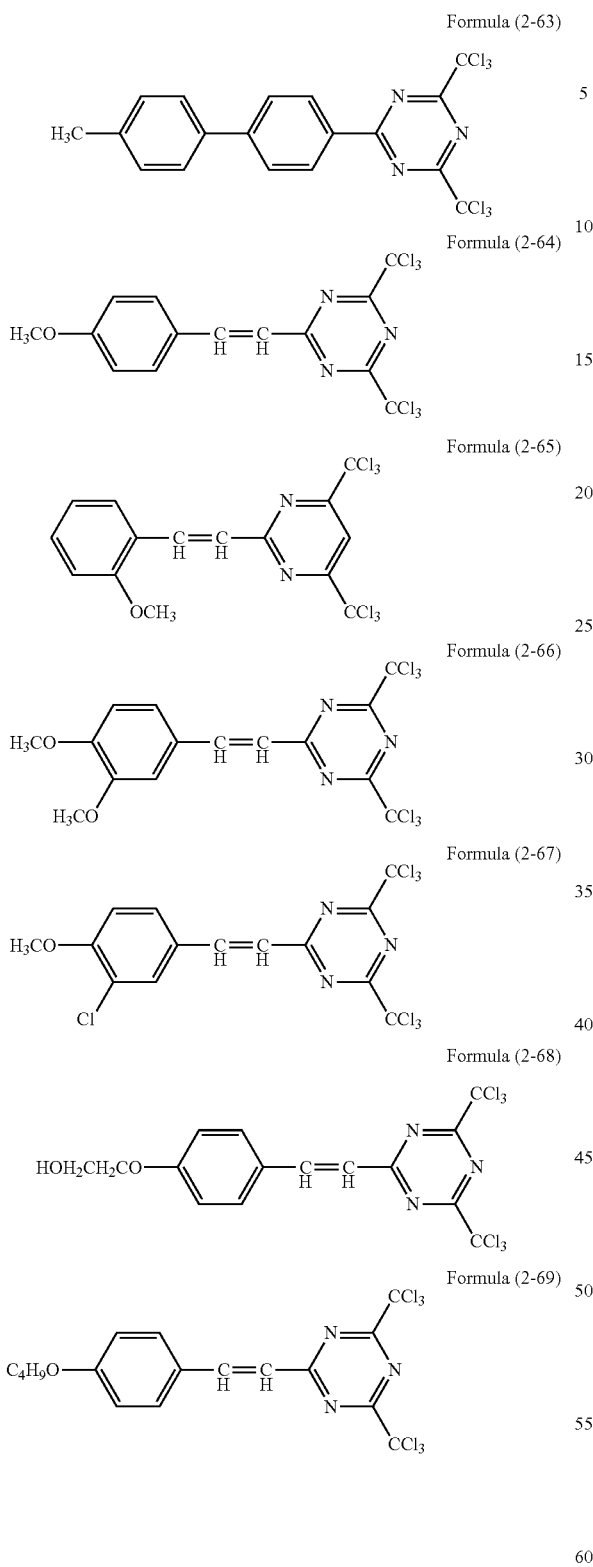
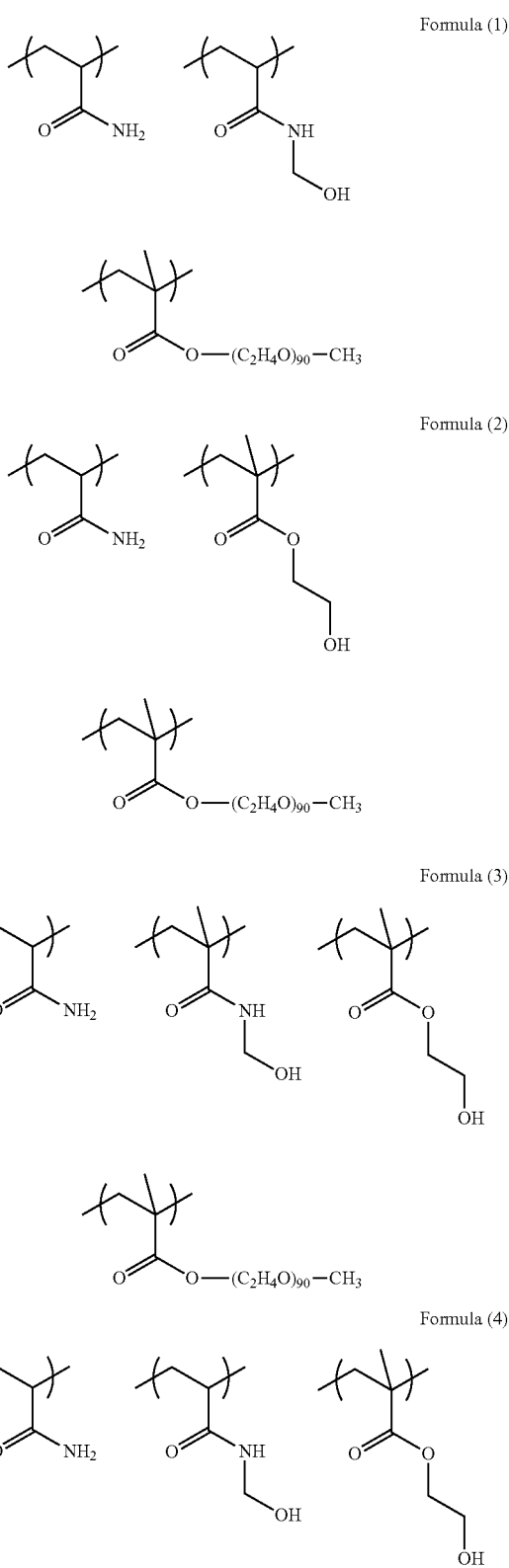
One kind of the photoacid generator can be used alone, or two or more kinds thereof can be used in combination.
In the present invention, preferable examples of the water-soluble organic particles include polymers including combinations of unit structures of the following Formulae (1) to (7).

Formula (5)

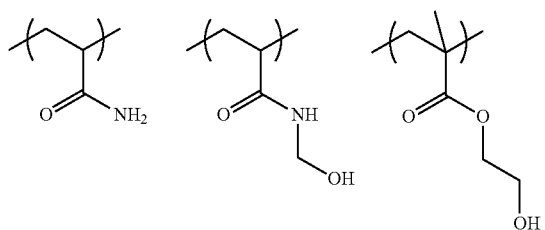

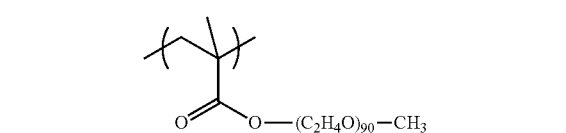

Formula (6)

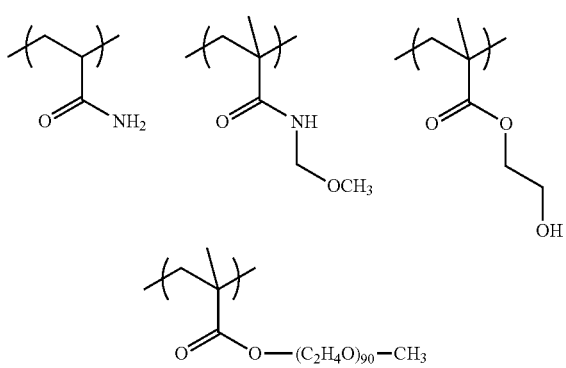

Formula (7)

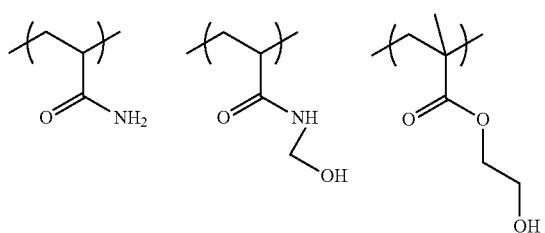

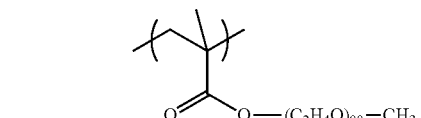

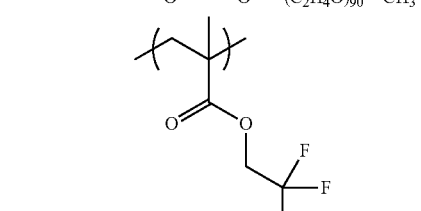

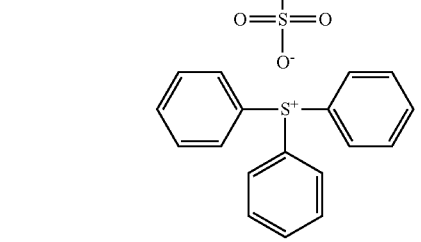

In the present invention, the water-soluble organic particles can contain the unit structures (A) to (C) in at a molar ratio of unit structure (A):unit structure (B):unit structure (C)=1:0.01 to 3.00:0.0001 to 0.1.

Moreover, the water-soluble organic particles can contain the unit structures (A) to (D) at a molar ratio of unit structure (A):unit structure (B):unit structure (C):unit structure (D)=1: 0.01 to 3.00:0.0001 to 0.1:0.000001 to 0.1.

When a polymer containing the unit structure (A), the unit structure (B), the unit structure (C), and optionally a unit structure (D) is polymerized, azobisisobutyronitrile or the like can be used as a polymerization initiator.

The polymerization is radical polymerization and performed in a solvent described later that dissolves a compound forming the unit structures (A) to (D) but is a poor solvent for the water-soluble organic particles formed after the polymerization. The polymerization temperature is, for example, 60° C. to 180° C. or a reflux temperature of the solvent. The polymerization can be performed for 0.1 hours to 6 hours, for example.

A particle diameter of the water-soluble organic particles is preferably within a range of 10 nm to 1,500 nm, 50 nm to 1,000 nm, or 100 nm to 800 nm.

The solvent used in the present invention is a poor solvent for the water-soluble organic particles. That is, the solvent practically does not dissolve the water-soluble organic particles and dissolves the photoacid generator. Further, preferable examples of the solvent include solvents having a high degree of coating properties. Examples of such solvents include solvents including ether, ester, hydrocarbon, ketone, aldehyde, and alcohol. The examples include methyl cellosolve acetate, ethyl cellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether, acetate, propylene glycol monopropyl ether acetate, propylene glycol monobutyl ether acetate, toluene, xylene, methyl ethyl ketone, cyclopentanone, cyclohexanone, ethyl 2-hyroxypropionate, ethyl 2-hydroxy-2-methyl propionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, methyl 3-methoxy-2-methylpropionate, methyl 2-hydroxy-3-methylbutyrate, ethyl methoxyacetate, 3-methoxybutylacetate, 3-methoxypropylacetate, 3-methyl-3-methoxybutylacetate, 3-methyl-3-methoxybutylpropionate, 3-methyl-3-methoxybutylbutyrate, methyl acetoacetate, methyl propyl ketone, methyl butyl ketone, 2-heptanone, 3-heptanone, 4-heptanone, N,N-dimethylformamide, N-methylacetamide, N,N-dimethylacetamide, N-methyl-2-pyrrolidone, γ-butyrolactone, ethanol, propanol, isopropanol, butanol, and the like. These solvents may be used alone, or two or more kinds thereof can be used in combination.

Among these, as the solvent used in the present invention, propylene glycol monomethyl ether, propylene glycol monomethyl ether acetate, ethylene glycol monobutyl ether, ethanol, propanol, isopropanol, and butanol are preferable, and particularly, propylene glycol monomethyl ether can be preferably used.

A solid content in the photosensitive composition of the present invention is, for example, 0.1% by mass to 30% by mass, 0.1% by mass to 20% by mass, or 1% by mass to 10% by mass. The solid content is a component that remains after the solvent (poor solvent) is removed from all components of the photosensitive composition.

When the water-soluble organic particles have a photoacid generating group, a proportion of the water-soluble organic particles in the solid content is, for example, 70% by mass to 100% by mass, 80% by mass to 99.5% by mass, or 80% by mass to 90% by mass.

In addition, when the water-soluble organic particles do not have a photoacid generating group and the photosensitive composition contains a photoacid generator separately, a proportion of the water-soluble organic particles in the solid content is, for example, 70% by mass to 99.9% by mass, 80% by mass to 95% by mass, or 80% by mass to 98% by mass, and the photoacid generator can be contained in the solid content in a proportion of 0.1% by mass to 20% by mass or 1% by mass to 10% by mass.

The photosensitive composition of the present invention can contain, as other components, other additives that are generally added to a photosensitive composition, such as a surfactant and the like.

The photosensitive composition according to the present invention can also contain a basic compound. Examples of the basic compound include amine. If a basic compound is added, it is possible to regulate the sensitivity of a photosensitive coating formed of the photosensitive composition during exposure. That is, the basic compound such as amine reacts with an acid that is generated by the photoacid generating group or the photoacid generator during exposure, whereby the sensitivity of the photosensitive coating can be reduced. Moreover, it is possible to inhibit the acid, which is generated by the photoacid generating group or the photoacid generator in the photosensitive coating of the exposed portion, from diffusing to the photosensitive coating of an unexposed portion.

The above amine is not particularly limited, but examples thereof include tertiary amines such as triethanolamine, tributanolamine, trimethylamine, triethylamine, tri-n-propylamine, triisopropylamine, tri-n-butylamine, tri-tert-butylamine, tri-n-octylamine, triisopropanolamine, phenyl diethanolamine, stearyl diethanolamine, and diazabicyclooctane, and aromatic amines such as pyridine and 4-dimethylaminopyridine. The examples also include primary amines such as benzylamine and n-butylamine, secondary amines such as diethylamine and di-n-butylamine.

Amine can be used alone or used in combination of two or more kinds thereof. When amine is used, the content thereof is 0.001 parts by mass to 5 parts by mass, 0.01 parts by mass to 1 part by mass for example, or 0.1 parts by mass to 0.5 parts by mass, based on 100 parts by mass of the solid content of the photosensitive composition. When the amine content is larger than the above value, there are cases where sensitivity is excessively reduced.

Hereinafter, use of the photosensitive composition of the present invention, that is, a pattern forming method using the composition will be described.

First, the photosensitive composition of the present invention is applied to various substrates (for example, a glass substrate, a ceramics substrate, a plastic substrate, a silicon wafer, and the like) as base materials by an appropriate coating method such as a spinner, a coater, and the like, and then, baked (dried) to form a photosensitive coating. The baking conditions are appropriately selected from a baking temperature of 50° C. to 100° C. and a baking time of 0.1 minutes to 10 minutes. The baking temperature is preferably 60° C. to 90° C., and the baking time is preferably 1 minute to 5 minutes. Herein, a thickness of the photosensitive coating to be formed is several nm to several µm.

Next, the photosensitive coating is exposed to light through a predetermined mask. For the exposure, g-rays (wavelength of 436 nm), h-rays (wavelength of 405 nm), i-rays (wavelength of 365 nm), a KrF excimer laser (wavelength of 248 nm), an ArF excimer laser (wavelength of 193 nm), an F2 excimer laser (wavelength of 157 nm), and the like can be used.

After the exposure, post exposure bake can be performed if necessary. The post exposure bake is performed under the conditions appropriately selected from a heating temperature of 100° C. to 200° C. and a heating time of 1 minute to 20 minutes.

Subsequently, developing is performed using a developer. In the present invention, the photosensitive coating obtained from the photosensitive composition is a negative resist. In the exposed portion, a dehydration reaction of a hydroxy group is caused by an acid generated from the photoacid generator. Accordingly, particles are crosslinked to each other to form a crosslinked structure, so the particles do not dissolve in the developer.

The developer is water or an aqueous medium. The aqueous medium has pH around a neutral region, and can contain additives such as a surfactant. However, pure water can be preferably used.

EXAMPLES

Hereinafter, the present invention will be described in detail based on examples; however, the present invention is not limited to these examples.

Synthesis Example 1

A mixture obtained by dissolving 5.5 g of acrylamide, 1.5 g of N-hydroxymethyl acrylamide, 1.0 g of 2-hydroxyethyl methacrylate, 1.5 g of Blemmer PME4000 (trade name, manufactured by NOF CORPORATION), and 0.13 g of azobisisobutyronitrile in 14.4 g of propylene glycol monomethyl ether was added dropwise for 2 hours to 24.1 g of propylene glycol monomethyl ether which was being heated under reflux. The obtained dispersion having a 20% solid content was milky-white, the water-soluble organic particles were particles formed of a polymer corresponding to the polymer having the unit structure of Formula (4), and a particle diameter of the obtained water-soluble organic particles was 300 nm to 500 nm (by SEM observation).

Synthesis Example 2

A mixture obtained by dissolving 5.5 g of acrylamide, 1.5 g of N-hydroxymethyl acrylamide, 1.0 g of 2-hydroxyethyl methacrylate, 0.5 g of Blemmer PME4000 (trade name, manufactured by NOF CORPORATION), and 0.13 g of azobisisobutyronitrile in 12.9 g of propylene glycol monomethyl ether was added dropwise for 2 hours to 21.6 g of propylene glycol monomethyl ether which was being heated under reflux. The obtained dispersion having a 20% solid content was milky-white, the water-soluble organic particles were particles formed of a polymer corresponding to the polymer having the unit structure of Formula (4), and a particle diameter of the obtained water-soluble organic particles was 500 nm to 800 nm (by SEM observation).

Synthesis Example 3

A mixture obtained by dissolving 5.5 g of acrylamide, 1.5 g of N-hydroxymethyl acrylamide, 1.0 g of 2-hydroxyethyl methacrylate, 3.0 g of Blemmer PME4000 (trade name, manufactured by NOF CORPORATION), and 0.13 g of azobisisobutyronitrile in 16.7 g of propylene glycol monomethyl ether was added dropwise for 2 hours to 27.8 g of propylene glycol monomethyl ether which was being heated under reflux. The obtained dispersion having a 20% solid content was milky-white, the water-soluble organic particles were particles formed of a polymer corresponding to the polymer having the unit structure of Formula (4), and a particle diameter of the obtained water-soluble organic particles was 100 nm to 200 nm (by SEM observation).

Synthesis Example 4

A mixture obtained by dissolving 5.5 g of acrylamide, 1.5 g of N-hydroxymethyl acrylamide, 1.0 g of 2-hydroxyethyl methacrylate, 1.5 g of Blemmer PME1000 (trade name, manufactured by NOF CORPORATION), and 0.13 g of azobisisobutyronitrile in 14.4 g of propylene glycol monomethyl ether was added dropwise for 2 hours to 24.1 g of propylene glycol monomethyl ether which was being heated under reflux. The obtained dispersion having a 20% solid content was milky-white, the water-soluble organic particles were particles formed of a polymer corresponding to the polymer having the unit structure of Formula (5), and a particle diameter of the obtained water-soluble organic particles was 100 nm to 300 nm (by SEM observation).

Synthesis Example 5

A mixture obtained by dissolving 5.5 g of acrylamide, 1.5 g of N-methoxymethyl methacrylamide, 1.0 g of 2-hydroxyethyl methacrylate, 1.5 g of Blemmer PME4000 (trade name, manufactured by NOF CORPORATION), and 0.13 g of azobisisobutyronitrile in 14.4 g of propylene glycol monomethyl ether was added dropwise for 2 hours to 24.1 g of propylene glycol monomethyl ether which was being heated under reflux. The obtained dispersion having a 20% solid content was milky-white, the water-soluble organic particles were particles formed of a polymer corresponding to the polymer having the unit structure of Formula (6), and a particle diameter of the obtained water-soluble organic particles was 300 nm to 500 nm (by SEM observation).

Synthesis Example 6

A mixture obtained by dissolving 5.5 g of acrylamide, 1.5 g of N-hydroxymethyl acrylamide, 1.5 g of Blemmer PME4000 (trade name, manufactured by NOF CORPORATION), and 0.13 g of azobisisobutyronitrile in 15.0 g of propylene glycol monomethyl ether was added dropwise for 2 hours to 25.0 g of propylene glycol monomethyl ether which was being heated under reflux. The obtained dispersion having a 20% solid content was milky-white, the water-soluble organic particles were particles formed of a polymer corresponding to the polymer having the unit structure of Formula (1), and a particle diameter of the obtained water-soluble organic particles was 300 nm to 500 nm (by SEM observation).

Synthesis Example 7

A mixture obtained by dissolving 5.5 g of acrylamide, 1.5 g of N-hydroxymethyl acrylamide, 1.0 g of 2-hydroxyethyl methacrylate, 1.5 g of Blemmer PME4000 (trade name, manufactured by NOF CORPORATION), 0.01 g of TPS-IMA (trade name) (generic name: triphenylsulfonium 2-methacryloyloxy-1,1-difluoroethanesulfonate, manufactured by Central Glass Co., Ltd.), and 0.13 g of azobisisobutyronitrile in 14.4 g of propylene glycol monomethyl ether was added dropwise for 2 hours to 24.1 g of propylene glycol monomethyl ether which was being heated under reflux. The obtained dispersion having a 20% solid content was milky-white, the water-soluble organic particles were particles formed of a polymer corresponding to the polymer having the unit structure of Formula (7), and a particle diameter of the obtained water-soluble organic particles was 300 nm to 500 nm (by SEM observation).

Comparative Synthesis Example 1

A mixture obtained by dissolving 10 g of acrylamide, 2.7 g of N-hydroxymethyl acrylamide, 1.8 g of 2-hydroxyethyl methacrylate, 2.7 g of Blemmer PME4000 (trade name, manufactured by NOF CORPORATION), 0.9 g of acrylic acid, and 0.23 g of azobisisobutyronitrile in 30.9 g of propylene glycol monomethyl ether was added dropwise for 2 hours to 31.5 g of propylene glycol monomethyl ether which was being heated under reflux. The obtained dispersion having a 20% solid content was milky-white, the organic particles were particles formed of a polymer corresponding to the polymer having the unit structure of the following Formula (1-1), and a particle diameter of the obtained organic particles was 200 nm to 300 nm (by SEM observation).

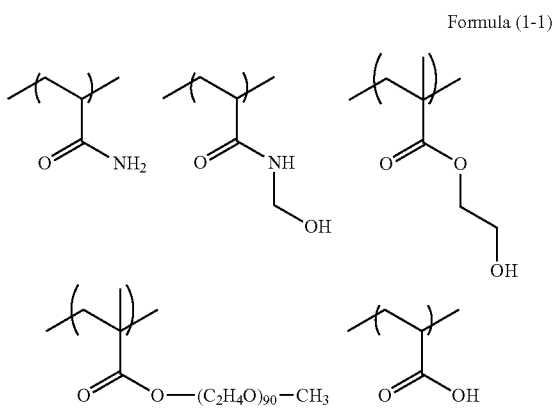

Formula (1-1)

Example 1

0.01 g of a photoacid generator PAI-1001 (trade name, Midori Kagaku Co., Ltd., the compound of Formula (2-35))

and 18.8 g of propylene glycol monomethyl ether were added to 2 g of the dispersion obtained in Synthesis Example 1 to obtain a dispersion (photosensitive composition 1).

Formula (2-35)

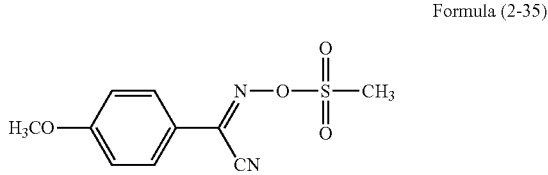 [SMILES: COc1ccc(/C(C#N)=N/OS(C)(=O)=O)cc1]

Example 2

18.8 g of propylene glycol monomethyl ether was added to 2 g of the dispersion obtained in Synthesis Example 7 to obtain a dispersion (photosensitive composition 2).

Comparative Example 1

0.01 g of a photoacid generator PAI-1001 (tradename, manufactured by Midori Kagaku Co., Ltd.) and 18.8 g of propylene glycol monomethyl ether were added to 2 g of the dispersion obtained in Comparative Synthesis Example 1 to obtain a dispersion (photosensitive composition 3).

[Patterning Test]

Figure 2:
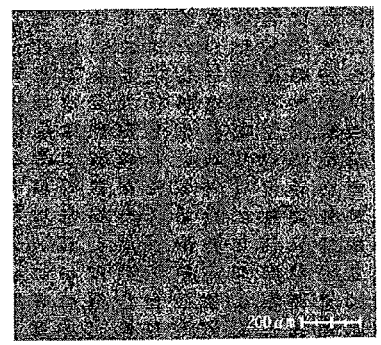
FIG. 2 is a view of an optical microphotograph of a 500 μm×500 μm square pattern formed on a silicon wafer using the photosensitive composition 1 prepared in Example 1.
Figure 3:
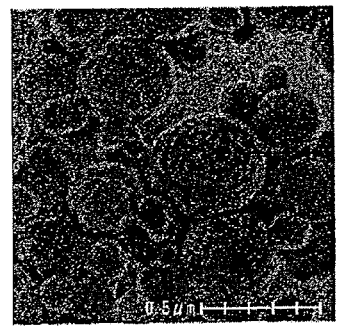
FIG. 3 is a view showing an SEM image of a portion irradiated with light in a 500 μm×500 μm square pattern formed on a silicon wafer using the photosensitive composition 1 prepared in Example 1.
Figure 4:
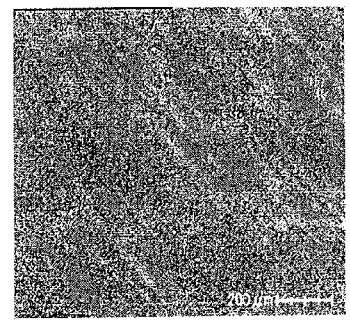
FIG. 4 is a view of an SEM image of a portion not irradiated in a 500 μm×500 μm square pattern formed on a silicon wafer using the photosensitive composition 1 prepared in Example 1.

The photosensitive composition 1 prepared in Example 1 was applied to a silicon wafer using a spin coater, and prebaked for 1 minute at 80° C. on a hot plate so that water-soluble organic particles were supported on the wafer. Thereafter, using an i-ray aligner PLA-501 (manufactured by CANON. INC, exposure dose of 100 mJ/cm²), light exposure was performed through a mask. Subsequently, the resultant was subjected to post exposure bake (PEB) on a hot plate for 10 minutes at 190° C., exposed to water for 60 seconds, and dried, thereby forming a 500 μm×500 μm square pattern. FIG. 1 shows a square pattern formed using the photosensitive composition 1 prepared in Example 1, FIG. 2 shows an optical microphotograph of the square pattern, FIG. 3 shows an SEM image of a portion irradiated with light in the square pattern, and FIG. 4 shows an SEM image of a portion not irradiated in the square pattern, respectively.

Likewise, using the photosensitive composition 2 prepared in Example 2 and the photosensitive composition 3 prepared in Comparative Example 1, patterning tests were conducted in the same manner as in Example 1.

By the optical microphotograph and SEM observation, the photosensitive compositions 1 and 2 prepared in Examples 1 and 2 were confirmed to be able to create a pattern of organic particles. However, the organic particles supported on a silicon wafer of the photosensitive composition 3 that was prepared in Comparative Example 1 were originally insoluble in water, so a pattern could not be formed by developing treatment using water.

INDUSTRIAL APPLICABILITY

The photosensitive composition of the present invention is a patternable material which can form a pattern by being applied to a base material and dried to form a photosensitive coating, exposed to light, and subjected to development.

The invention claimed is:

1. A photosensitive composition comprising:
   water-soluble organic particles;
   a solvent; and
   a photoacid generator
   wherein:
   the solvent is a poor solvent for the water-soluble organic particles; and
   the water-soluble organic particles include a polymer that contains a unit structure (A) for forming organic particles, a unit structure (B) for forming interparticle crosslinkage, and a unit structure (C) for imparting dispersibility.

2. The photosensitive composition according to claim 1, wherein
   the water-soluble organic particles include a polymer which contains the unit structure (A) for forming organic particles, the unit structure (B) for forming interparticle crosslinkage, the unit structure (C) for imparting dispersibility, and a unit structure (D) having a photoacid generating group.

3. The photosensitive composition according to claim 1, wherein a monomer forming the unit structure (A) is (meth) acrylic acid amide, N-alkyl(meth)acrylic acid amide, or N-aryl(meth)acrylic acid amide.

4. The photosensitive composition according to claim 1, wherein a monomer forming the unit structure (B) is N-hydroxyalkyl(meth)acrylic acid amide, N-hydroxyaryl(meth) acrylic acid amide, N-alkoxyalkyl(meth)acrylic acid amide, N-alkoxyaryl(meth)acrylic acid amide, hydroxyalkyl(meth) acrylate, hydroxyaryl(meth)acrylate, alkoxyalkyl(meth) acrylate, or alkoxyaryl(meth)acrylate.

5. The photosensitive composition according to claim 1, wherein a monomer forming the unit structure (C) is a compound obtained by esterifying (meth)acrylic acid using polyether.

6. The photosensitive composition according to claim 1, wherein the water-soluble organic particles contain the unit structure (A), the unit structure (B), and the unit structure (C) at a molar ratio of 1:0.01 to 3.00:0.0001 to 0.1 (A:B:C).

7. The photosensitive composition according to claim 2, wherein the water-soluble organic particles contain the unit structure (A), the unit structure (B), the unit structure (C), and the unit structure (D) at a molar ratio of 1:0.01 to 3.00:0.0001 to 0.1:0.1 to 3.00 (A:B:C:D).

8. The photosensitive composition according to claim 1, wherein the poor solvent is a solvent including ether, ester, hydrocarbon, ketone, aldehyde, or alcohol.

9. The photosensitive composition according to claim 1, wherein the poor solvent is a solvent including propylene glycol monomethyl ether, propylene glycol monomethyl ether acetate, ethylene glycol monobutyl ether, ethanol, propanol, isopropanol, or butanol.

10. A pattern forming method comprising:
    a step of applying the photosensitive composition according to claim 1 to a base material and drying to form a photosensitive coating;
    a step of exposing the coating to light through a mask; and
    a step of performing developing using a developer.

11. The pattern forming method according to claim 10, further comprising a step of performing heating after the step of exposing.

12. The pattern forming method according to claim 10, wherein the developer is water or an aqueous medium.

* * * * *